United States Patent
Szu

(10) Patent No.: US 7,892,009 B2
(45) Date of Patent: Feb. 22, 2011

(54) ELECTRICAL CONNECTOR HAVING COVER PLATE FOR REDUCING FRICTION BETWEEN COVER AND BASE

(75) Inventor: Ming-Lun Szu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/511,258

(22) Filed: Jul. 29, 2009

(65) Prior Publication Data

US 2010/0029121 A1 Feb. 4, 2010

(30) Foreign Application Priority Data

Jul. 29, 2008 (TW) .............................. 97213401 U

(51) Int. Cl.
  *H01R 4/50* (2006.01)
  *H01R 13/625* (2006.01)
(52) U.S. Cl. ...................................... 439/342; 439/259
(58) Field of Classification Search ................. 439/342, 439/259, 262
  See application file for complete search history.

(56) References Cited

U.S. PATENT DOCUMENTS

| | | | |
|---|---|---|---|
| 6,250,941 B1 | 6/2001 | Huang et al. | |
| 6,254,415 B1 | 7/2001 | Mizumura | |
| 6,280,224 B1 | 8/2001 | Huang | |
| 6,296,507 B1 | 10/2001 | Huang | |
| 6,338,640 B1 | 1/2002 | Lin | |
| 6,450,825 B1 * | 9/2002 | Huang | 439/342 |
| 6,609,926 B1 * | 8/2003 | Chen et al. | 439/342 |
| 6,692,281 B1 * | 2/2004 | McClinton et al. | 439/342 |
| 6,921,276 B2 * | 7/2005 | McClinton | 439/342 |
| 7,056,140 B1 * | 6/2006 | Jiang | 439/342 |
| 7,108,536 B2 * | 9/2006 | Yu et al. | 439/342 |
| 7,114,978 B2 * | 10/2006 | He et al. | 439/342 |
| 7,473,122 B2 * | 1/2009 | Zhou et al. | 439/342 |
| 7,563,120 B1 * | 7/2009 | Jin | 439/342 |
| 7,641,496 B2 * | 1/2010 | Xu et al. | 439/342 |
| 2005/0042909 A1 * | 2/2005 | Sun | 439/342 |

* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

An electrical connector includes a base having a number of passageways, a cover mounted to the base, a cam mounted between the base and the cover, and a protecting mechanism. The cover has a number of through holes corresponding to the passageways and is capable of slidably moveable relative to the base. The cam is able to rotate to drive the cover to move relative to the base. The protecting mechanism includes a cover plate mounted in the cover and a base element mounted in the base. The cover plate includes a planar main portion, a via hole defined in a middle thereof, and a pair of stoppers bent toward the cover to engage to restrict the cam to rotate within a certain angle.

18 Claims, 5 Drawing Sheets

ELECTRICAL CONNECTOR HAVING COVER PLATE FOR REDUCING FRICTION BETWEEN COVER AND BASE

BACKGROUND OF THE INVENTION

1. Field of the Invention

The present invention relates to an electrical connector, and more particularly to an electrical connector for a Pin Grid Array (PGA) package, which has a cover plate mounted within a cover and adapted to decrease frictional coefficient between the cover plate and a cam.

2. Description of the Prior Art

Mostly Central Process Units (CPU) is connected with a printed circuit board by an electrical connector, that are disclosed in "Ball Grid Array (BGA) Socket: a dendrite solution" (P460-P466, 1996 IEEE $46^{th}$ Electronic Components & Technology Conference). In addition, the electrical connector is manufactured to have a cam actuator for a low profile, such as the U.S. Pat. Nos. 6,250,941, 6,254,415, 6,280,224, 6,296,507 and 6,338,640 disclosed. U.S. Pat. No. 6,338,640 issued to Lin on Jan. 15, 2002 discloses an electrical connector with a cam actuator. The electrical connector comprises an insulative base, a cover, a plurality of terminals received in the base, a metallic cam actuator, and a protecting mechanism. The cover has a plurality of through holes corresponding to the terminals, thus permitting lead pins of the CPU to be inserted in the through holes. The base and the cover are slidably interconnected so that the cover is driven in a plane parallel to the underlying base between a first position in which the lead pins of the CPU can pass through the through holes of the cover to reach the contact mounted in the underlying base without requiring and insertion force to applied to the lead pin and a second position in which the lead pins of the CPU contact the terminals. The protecting mechanism comprises a T-shaped metal cover plate inserting in the cover and a T-shaped metal bottom plate received in a recess of the base. The cover plate and the bottom plate are both manufactured by die casting. That makes the cover plate has a coarse surface to engage with the cam actuator, so that it will increase a frictional coefficient between the cover plate and the cam actuator.

Therefore, it is need to find a new electrical connector having an improved cover plate to overcome the problems mentioned above.

SUMMARY OF THE INVENTION

Accordingly, an object of the present invention is to provide an electrical connector having a stamping cover plate mounted within a cover and adapted to decrease a frictional coefficient between the cover plate and a cam.

In order to achieve the object set forth, an electrical connector comprises a base having a plurality of passageways, a cover mounted to the base, a cam mounted between the base and the cover, and a protecting mechanism. The cover has a plurality of through holes corresponding to the passageways and is capable of slidably moveable relative to the base. The cam is able to rotate to drive the cove to move relative to the base. The protecting mechanism comprises a cover plate mounted in the cover and a base element mounted in the base. The cover plate comprises a planar main portion, a via hole defined in a middle thereof, and a pair of stoppers bent toward the cover to engage with the cam and restrict the cam to rotate within a certain angle.

In order to further achieve the object set forth, an electrical connector, comprises a base having a plurality of passageways, a cover mounted to the base, a cam mounted between the base and the cover, and a protecting mechanism. The cover has a plurality of through holes corresponding to the passageways and slidably moves relative to base. The cam is rotated to drive the cove to move relative to the base. The protecting mechanism comprises a cover plate mounted in the cover and a base element mounted in the base. The cover plate is formed by stamping. The cover plate comprises a planar main portion, a via hole defined in a middle thereof and formed by drawing, and a pair of stoppers bent toward the cover for engaging with the cam.

DESCRIPTION OF PREFERRED EMBODIMENT

Figure 1:
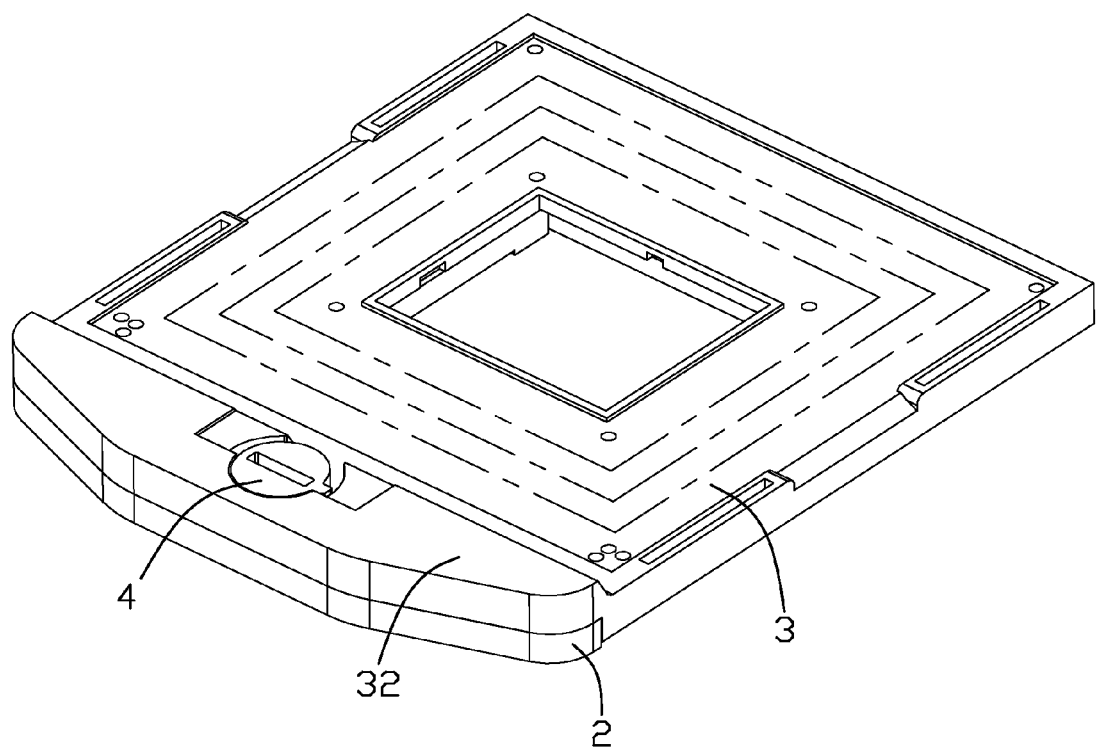
FIG. 1 is an assembled perspective view of an electrical connector according to the present invention.
Figure 2:
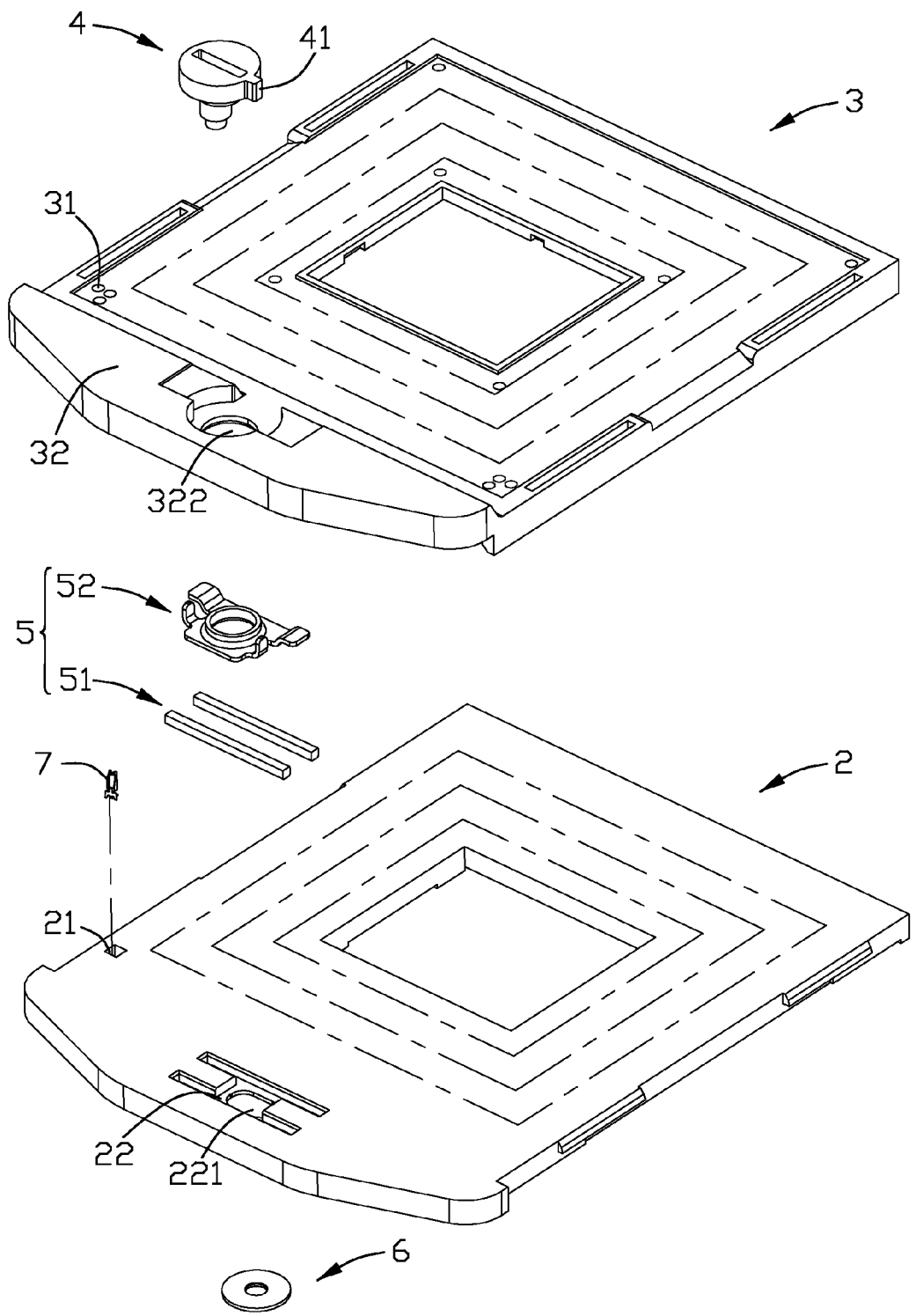
FIG. 2 is an exposed perspective view of the electrical connector of FIG. 1.

Reference will now be made to the drawings to describe the present invention in detail.

FIG. 1 to FIG. 5 show an electrical connector for electrically connecting a printed circuit board (not shown) to a Pin Grid Array (PGA) package (not shown). The electrical connector comprises a base 2, a plurality of contacts 7 received in the base 2, a cover 3 slidably mounted to the base 2, a cam 4 mounted between the cover 3 and the base 2, a protecting mechanism 5, and a washer 6.

The base 2 is made of insulative material and is formed with a substantially rectangular configuration. The base 2 defines a plurality of passageways 21 to receive the contacts 7. The base 2 has a head portion thereof and defines a recess 22 in the middle of the head portion. The recess 22 is an H-shaped configuration and a base hole 221 is defined in a middle of the recess 22 for receiving corresponding portion of the cam 4.

The cover 3 is mounted to the base 2 and has a plurality of through holes 31 corresponding to the passageways 21 of the base 2. The cover 3 is able to move between an opened position in which lead pins (not shown) of the PGA package (not shown) can pass through the through holes 31 of the cover 3 and a closed position in which the lead pins (not shown) of the PGA package (not shown) mate with the contacts 7. The cover 3 has a head portion 32 extending from one end thereof. A first concave 320 is formed at a middle of a bottom surface of the head portion 32, and a second concave 321 is formed at a top surface of the head portion 32 corresponding to the first concave 320. A cover hole 322 passes through the first and the second concaves 320, 321. The second concave 321 is formed with two semicircles with different diameters. Two vertical sidewalls 3210 are formed where the two semicircles intersected.

Figure 3:
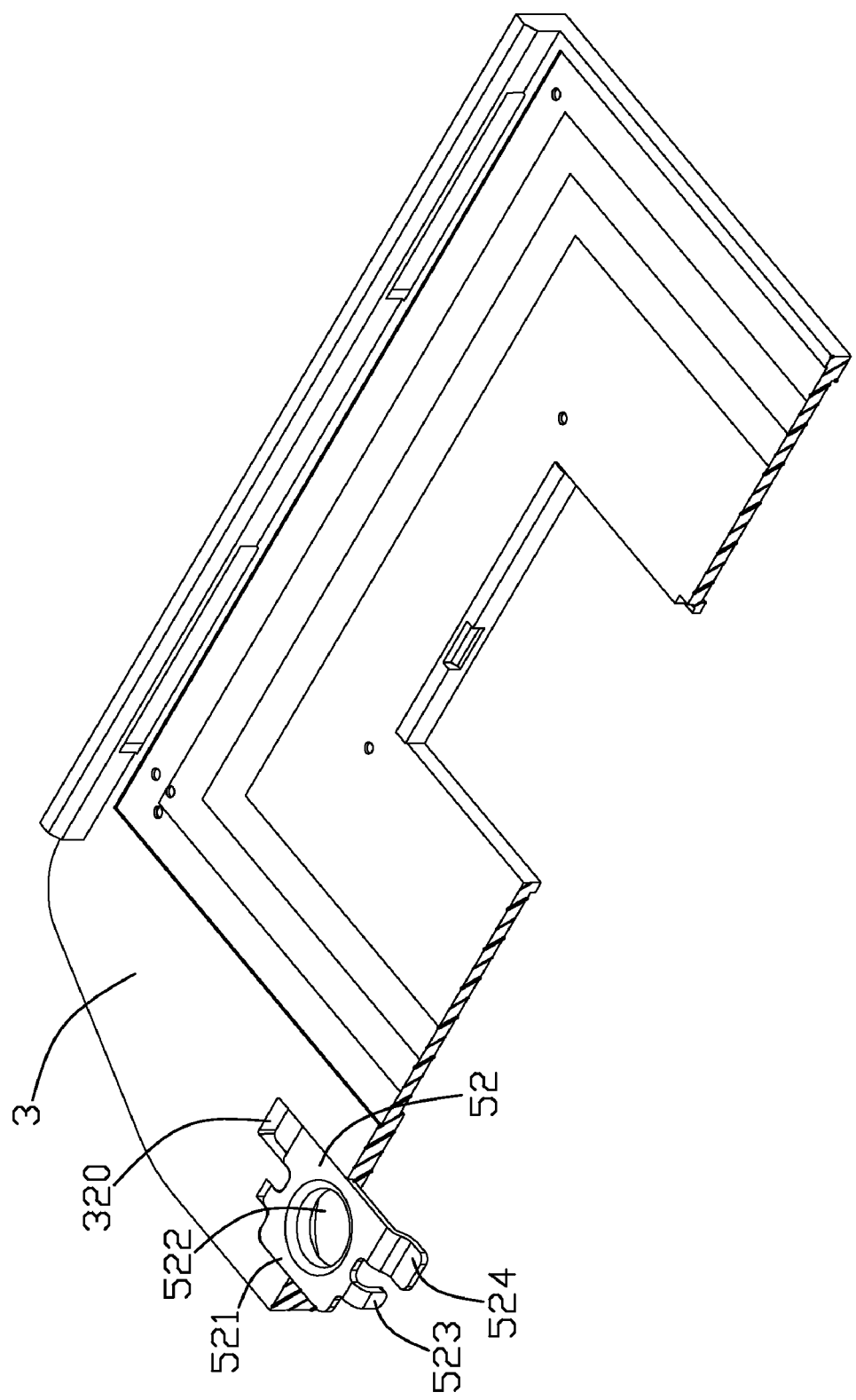
FIG. 3 is sectional view of a cover of the electrical connector with a cover plate, taken from a bottom side.
Figure 4:
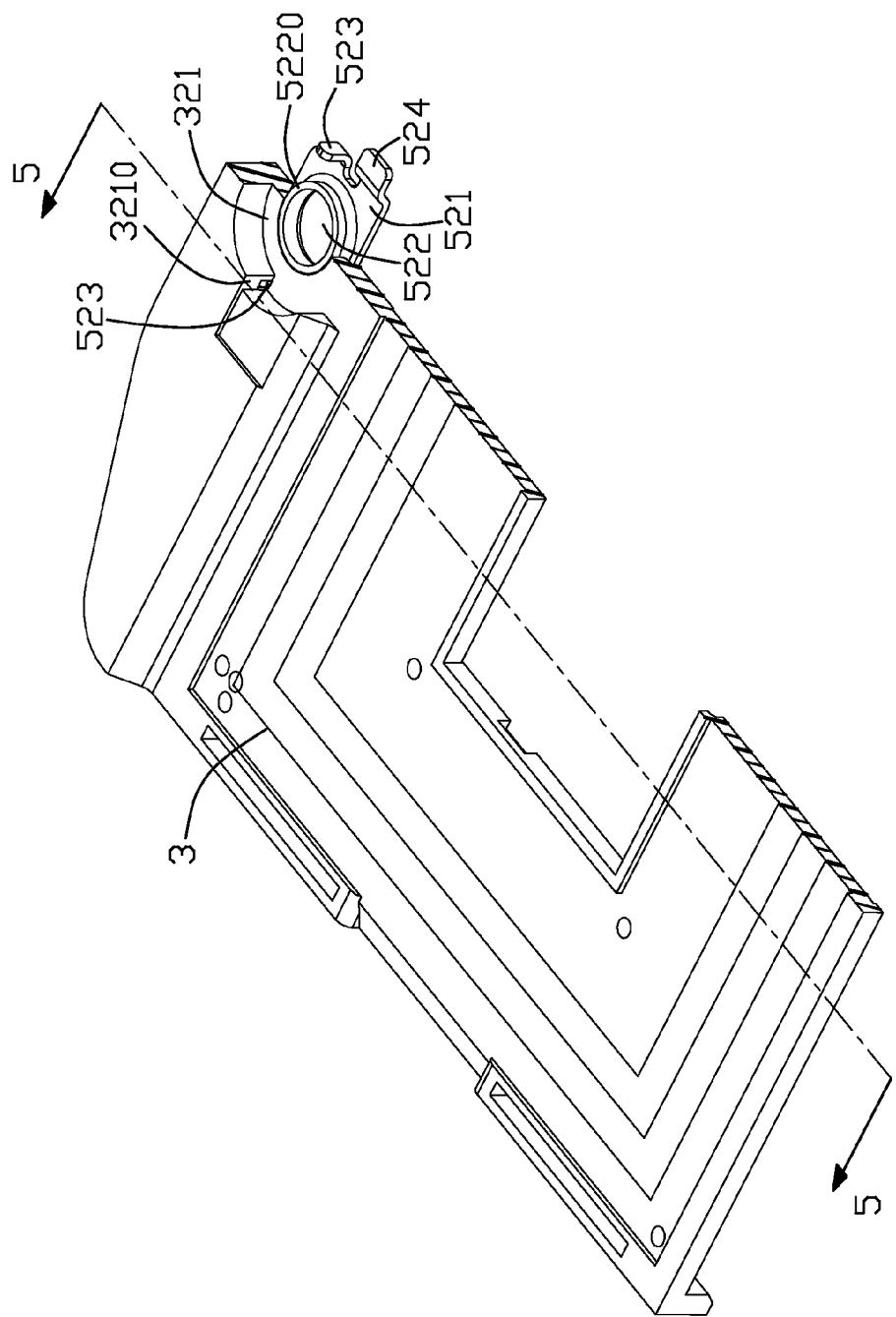
FIG. 4 is a top view of the cover with the cover plate of FIG. 3.
Figure 5:
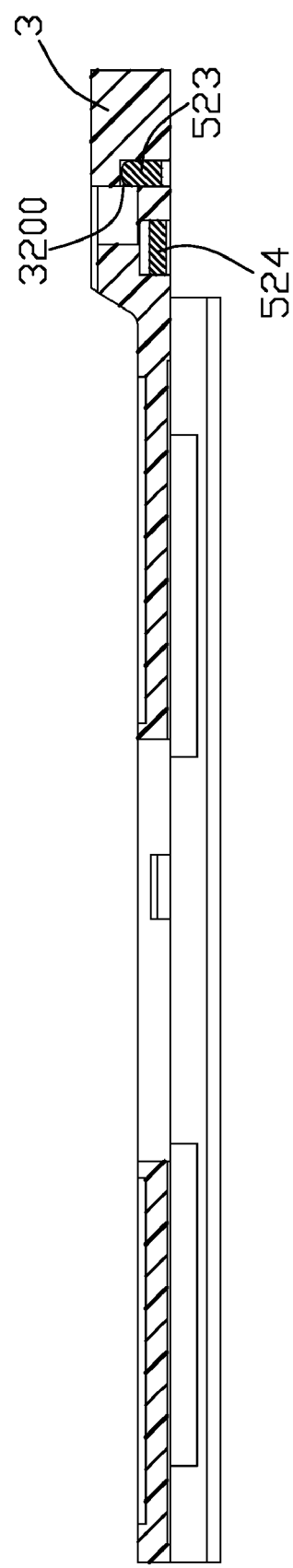
FIG. 5 is a cross-sectional view taken along line 5-5 of FIG. 4.

Referring to FIG. 3, the protecting mechanism 5 comprises a base elements 51 received in the recess 22 of the base 2 and a cover plate 52 retained in the first concave 320 of the cover 3. The base elements 51 are two metallic rods with rectangular cross sections. The cover plate 52 is stamped by a thin metallic sheet and comprises a planar and rectangular main portion 521. A circular via hole 522 is defined in a middle of the main portion 521 and has a shirting margin 5220 by drawing, and the shirting margin 5220 has a smooth inside wall and is sandwiched between the cam 4 and the cover 3 diametrically. The shirting margin 5220 passes through the cover hole 322 of the cover 3 and flushes with a bottom of the second concave 321. The main portion 521 further has two stoppers 523 positioned at opposite sides of the main portion 521 and two stiffener portions 524 positioned parallel to the stoppers 523. The stoppers 523 are curved upwardly toward to the cover 3, and the stiffener portions 524 are curved upwardly toward the cover 3 firstly and then extending parallel to the main portion 521.

The cam 4 comprises a plurality of non-coaxial posts and a protrusion 41 extending from a side of a top post. In assembling the electrical connector, mount the base elements 51 to the recess 22 of the base 2, and mount the cover plate 52 to the first concave 320 of the cover 3, then assemble the cover 3 to the base 2 and put the cam 4 to the cover 3, the cam 4 passing through the cover hole 322 and the base hole 221, lastly, assemble the washer 6 to a bottom of the cam 4 at the bottom of the base 2 for fastening the cam 4 to the cover 3 and the base 2. The first concave 320 of the cover 3 has a corresponding shape with the cover plate 52 for retaining the cover plate 52 and is tightly fitted with the cover plate 52. The first concave 320 has accommodating recesses 3200 for receiving the stoppers 523. The accommodating recesses 3200 extend through the sidewalls 3210 to partially expose the stopper 523 to the second concave 321. When the cam 4 is rotated relative to the base 2 and the cove 3, the protrusion 41 is stopped by the stoppers 523 at 180 degree to limit the distance of the cover 3 moving relative to the base 2.

In the present invention, the cover plate 52 is made of metallic sheet by stamping to reduce the cost and engages with the first concave 320 by tight fitting for easy assembly. The shirting margin 5220 of the cover plate 52 extends into the cover hole 322 to engage with the cam 4, because shirting margin 5220 is smooth, so that frictional coefficient between the cover plate 52 and the cam 4 is reduced and a strength of the cover plate 52 is enhanced. Further, the stiffener portions 524 and the via hole 522 of the cover plate 52 can reduce stress concentration of the cover 3.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector, comprising:
   a base having a plurality of passageways;
   a cover having a plurality of through holes corresponding to the passageways, the cover mounted to the base and slidably moveable relative to the base;
   a cam mounted between the base and the cover, and rotatable to drive the cover to move relative to the base;
   a protecting mechanism comprising a cover plate mounted in the cover and a base element mounted in the base, the cover plate comprising a planar main portion, a via hole defined in a middle thereof, and a pair of stoppers bent toward the cover from free outer edges of the main portion to engage with the cam and restrict the cam to rotate within a certain angle, and wherein
   the cover has a head portion protruding from one end of the cover, and includes a first concave formed at the middle of a bottom surface of the head portion, a second concave formed on a top surface of the head portion corresponding to the first concave, and a cover hole passing through the first and the second concaves.

2. The electrical connector as claimed in claim 1, wherein the cover plate is made of metallic material by stamping, and the via hole is formed by drawing.

3. The electrical connector as claimed in claim 2, wherein the via hole has a shirting margin with a smooth inner surface extending from an edge of the via hole and passing into a cover hole of the cover.

4. The electrical connector as claimed in claim 3, wherein the stoppers are disposed at opposite sides of the main portion, a pair of stiffener portions extends from the main portion and parallel to the stoppers, respectively.

5. The electrical connector as claimed in claim 4, wherein each stiffener portion bends at a same direction of the stopper firstly and then extends parallel to the main portion.

6. The electrical connector as claimed in claim 1, wherein the second concave is formed with two semicircles having different diameters, there are two vertical sidewalls on the two semicircles intersectant place.

7. The electrical connector as claimed in claim 6, wherein the first concave has accommodating recesses for receiving the stoppers, and the accommodating recesses are communicated with the second concave by through the vertical sidewalls to partially expose the stoppers to the second concave.

8. The electrical connector as claimed in claim 7, wherein the first concave has a corresponding shape with the cover plate and receives with the cover plate by tight fitting.

9. An electrical connector, comprising:
   a base having a plurality of passageways;
   a cover having a plurality of through holes corresponding to the passageways, the cover mounted to the base and slidably moveable relative to base;
   a cam mounted between the base and the cover, and rotateable to drive the cover to move relative to the base; and
   a protecting mechanism comprising a cover plate mounted in the cover and a base element mounted in the base, the cover plate being formed by stamping, the cover plate comprising a planar main portion, a via hole having a shirting margin and defined in a middle thereof and formed by drawing, and a pair of stoppers bent from free outer edges of the main portion and engaging with the cover to increase a combining force between the cover and the cover plate, the stoppers extending toward the cover to engage with the cam, the shirting margin extending into the cover hole of the cover for receiving the cam; wherein
   the cover has a head portion protruding from one end of the cover, and includes a first concave formed at the middle of a bottom surface of the head portion, a second concave formed on a top surface of the head portion corresponding to the first concave, and a cover hole passing through the first and the second concaves.

10. The electrical connector as claimed in claim 9, wherein the cover plate and the cover are assembled together by tight fitting.

11. The electrical connector as claimed in claim 10, wherein the cover plate further comprises a pair of stiffener portions to enhance an engaging force between the cover plate and the cover.

12. The electrical connector as claimed in claim 9, wherein the cam includes a protrusion thereof, the protrusion is stopped by the stoppers at 180 degree to limit the distance of the cover moving relative to the base.

13. An electrical connector comprising:
   an insulative base defining a plurality of passageways and a through hole in a head portion thereof;

a plurality of contacts disposed in the corresponding passageways, respectively;

an insulative cover mounted upon the slidable relative to the base, said cover defining a plurality of through passages in vertical alignment with the corresponding passageways, respectively, and a through aperture in thereof a head section in vertical alignment with the corresponding through hole of the base;

a cam extending axially and vertically in both said through hole and said through aperture; and a protecting mechanism including a metallic cover plate mounted to an undersurface of the cover and defining another through hole via a drawing process to form a tubular section extending upwardly into the through aperture and engaged with the cam for operation; wherein said tubular section is sandwiched between the cam and the cover diametrically; wherein said cover plate including the tubular section is essentially fully protectively hidden under both said insulative cover and said cam for not being upwardly exposed to an exterior.

14. The electrical connector as claimed in claim 13, wherein said cover plate is further equipped with a pair of upwardly extending stoppers to abut against the cam when a protrusion of the cam is moved to two opposite limit positions, respectively.

15. The electrical connector as claimed in claim 14, wherein said pair of upwardly extending stoppers are snugly received in corresponding slots of the cover without being upwardly exposed to the exterior.

16. The electrical connector as claimed in claim 15, wherein each of said upstanding stoppers defines a side edge abutting against the protrusion of the cam when said protrusion is moved to the corresponding limit position.

17. The electrical connector as claimed in claim 13, wherein said cover plate is further equipped with a pair of horizontally extending stiffeners to upwardly abut against the cover.

18. The electrical connector as claimed in claim 13, wherein the cover has a head portion protruding from one end of the cover, and includes a first concave formed at a middle of a bottom surface of the head portion, a second concave formed on a top surface of the head portion corresponding to the first concave, and the through hole passing through both the first and second concaves.

* * * * *